United States Patent
Peterson et al.

(12) 
(10) Patent No.: US 6,902,855 B2
(45) Date of Patent: Jun. 7, 2005

(54) QUALIFYING PATTERNS, PATTERNING PROCESSES, OR PATTERNING APPARATUS IN THE FABRICATION OF MICROLITHOGRAPHIC PATTERNS

(75) Inventors: Ingrid B. Peterson, Menlo Park, CA (US); Mike Von den Hoff, Müenchen (DE)

(73) Assignee: KLA-Tencor Technologies, Milpitas, CA (US)

( * ) Notice: Subject to any disclaimer, the term of this patent is extended or adjusted under 35 U.S.C. 154(b) by 276 days.

(21) Appl. No.: 10/211,156

(22) Filed: Aug. 2, 2002

(65) Prior Publication Data

US 2004/0009416 A1 Jan. 15, 2004

Related U.S. Application Data (60) Provisional application No. 60/396,197, filed on Jul. 15, 2002.

(51) Int. Cl.⁷ ................................................ G03F 9/00
(52) U.S. Cl. ........................ 430/30; 382/144; 382/145; 716/19; 716/20; 716/21
(58) Field of Search ........................... 430/30; 382/144, 382/145; 716/19, 20, 21

(56) References Cited

U.S. PATENT DOCUMENTS

| | | | |
|---|---|---|---|
| 5,965,306 A | | 10/1999 | Mansfield et al. |
| 6,171,737 B1 | * | 1/2001 | Phan et al. .................. 430/30 |
| 6,268,093 B1 | | 7/2001 | Kenan et al. |
| 6,373,975 B1 | | 4/2002 | Bula et al. |
| 6,701,004 B1 | | 3/2004 | Shykind et al. |
| 2002/0019729 A1 | | 2/2002 | Chang et al. |

FOREIGN PATENT DOCUMENTS

| | | |
|---|---|---|
| WO | 00/36525 | 6/2000 |

OTHER PUBLICATIONS

Sahouria et al., "Full Chip Process Simulation for Silicon DRC," Mentor Graphics, Mar. 2000, 6 pages.
Granik et al., "Sub-resolution process windows and yield estimation technique based on detailed full-chip CD simulation," Mentor Graphics, Sep. 2000, 5 pages.

* cited by examiner

*Primary Examiner*—Christopher G. Young
(74) *Attorney, Agent, or Firm*—Ann Marie Mewherter; Conley Rose P.C.

(57) ABSTRACT

The invention is a method of determining the presence of an anomaly in qualifying a pattern, patterning process, or patterning apparatus used in the fabrication of microlithographic patterns. A preferred implementation of the method qualifies incoming reticles and process conditions on test wafers to maximize the available usable process window for a given reticle exposure tool combination. Practicing this method on test wafers enables the identification of spatial areas where a process will fail first and candidate regions for carrying out defect inspection and metrology. Other preferred implementations of the method qualify masks, reticles, or other patterns characterized by data bases on which are stored image data acquired by practice of aerial image measurement system (AIMS) or design rule checking (DRC) techniques.

20 Claims, 12 Drawing Sheets

Single Die Reticle wafer layout

Die — Exposure Field

Fig. 1A
(Prior Art)

Multi-Die Reticle wafer layout

Die — Exposure Field

B = Exposed at Best Focus
A = Exposed at Focus Offset
as decided by the row in
steps of ±0.1 μm

Images of same location in exposure field region as it moves through focus range.

Fig. 11

Polysilicon pattern losing fidelity as it goes through focus

Fig. 12

QUALIFYING PATTERNS, PATTERNING PROCESSES, OR PATTERNING APPARATUS IN THE FABRICATION OF MICROLITHOGRAPHIC PATTERNS

RELATED APPLICATION

This application claims benefit of U.S. Provisional Patent Application No. 60/396,197, filed Jul. 15, 2002.

TECHNICAL FIELD

This invention relates to the manufacture of microelectronic devices and, in particular, to a method of qualifying a pattern, patterning process, or patterning apparatus used in the fabrication of microlithographic patterns for producing microelectronic devices.

BACKGROUND OF THE INVENTION

The rapid decrease in $k_1$ (line-width=$k_1$ ($\lambda$/NA)) in lithographic manufacture of semiconductor devices has necessitated the use of Resolution Enhancement Techniques (RET). These RET include, but are not limited to, Optical Proximity Corrections (OPC), Phase Shift Masks (PSM), and assist bar corrections. Although they are implemented in semiconductor device designs to facilitate low $k_1$ lithography, these RET make reticles more difficult and consequently more expensive to manufacture.

Semiconductor device design and reticle manufacturing quality are verified by different procedures before the reticle enters a semiconductor fabrication facility to begin production of integrated circuits. The semiconductor device design is checked by software simulation to verify that all features print correctly after lithography in manufacturing. The reticle is inspected at the mask shop for reticle defects and measured to ensure that the features are within specification. Marginal RET designs not noted by simulation checks translate into electrical failures in wafer fabrication, affect yield, and possibly remain unnoticed until wafer fabrication is complete.

Traditional methods employed in the inspection of complex mask patterns place tremendous demand on reticle inspection tools. One technique for performing image qualification entails using focus exposure matrix techniques. Performing an inspection of a conventional focus exposure matrix introduces a complication in that every exposure field is different. Die-to-die comparison is performed between adjacent local exposure fields. Any pattern change that may occur at a defocus position that is physically located farther than one exposure field from the nominal exposure field will not, therefore, be detected as different because the nominal exposure field is no longer factored in the comparison. Moreover, current reticle inspection techniques cannot detect the presence of an error in the design data base. Prior art single die reticle inspection entails implementation of a design simulation technique in which a signal derived from an actual reticle is subtracted from a simulated design reference.

What is needed, therefore, is an inspection technique that is effective in locating pattern anomalies in a single die or a multi-die reticle and detecting reticle design errors resulting from errors in the design data base.

SUMMARY OF THE INVENTION

An object of this invention is to provide a method of determining the presence of an anomaly in qualifying a pattern, patterning process, or patterning apparatus used in the fabrication of microlithographic patterns.

A preferred implementation of the present invention is a method of qualifying incoming reticles and process conditions on test wafers to maximize the available usable process window for a given reticle exposure tool combination. The method qualifies the image produced by the cumulative effect of various configurations of illumination sources, optical proximity correction artifacts, phase shifted imaging, and various photochemical processing techniques implemented at the imaging plane. Practicing this method on test wafers enables the identification of spatial areas where a process will fail first and candidate regions for carrying out defect inspection and metrology.

The nature of process window qualification is to induce pattern anomalies, such as transient repeating defects, by varying a process parameter or operating variable. One example of an operating variable is a lithographic operating variable, such as illumination. Focus of the exposing tool is one typical illumination operating variable. Transient or "soft" repeating defects are defects that print under only specific conditions, such as, for example, defocus level, exposure dose, and photoresist uniformity conditions. The term "soft defects" also refers to defects that are cleanable, unlike "hard defects," in which the pattern is permanently cast in the reticle. The narrowing process window, which is primarily reduced depth of focus, is used to intentionally amplify any unexpected patterning behavior. The method increases the capture rate of pattern anomalies that sometimes depend on coincidental confluence of exposure, focus, illumination, and resolution enhancement technology patterning at the wafer plane.

The process window qualification procedure implements die-to-die inspection of a plurality of dies or other repetitive patterns on a semiconductor wafer or other substrate on which design patterns are printed by photoresist patterning performed in accordance with a lithographic process using either a single die reticle or a multi-die reticle. The procedure entails selecting an illumination operating variable to modulate. Members of a set of possible illumination operating variables include illumination focus, illumination exposure, partial coherence of illumination, mode of illumination, and numerical aperture. A layer of pattern recording material such as a photoresist covering a test wafer substrate is exposed in the form of a grid of regions arranged in rows and columns. The columns are arranged in a pattern of "A" columns representing regions exposed to different values of a predetermined operating variable and "B" columns representing regions exposed to a common reference value of the predetermined operating variable. Conventional inspection techniques identifying differences in the "A" regions compared with the "B" regions eliminate hard repetitive anomalies. Comparing differences between "A" region values for a given column relative to a reference value identifies transient repetitive anomalies. Each repetitive anomaly identified is evaluated for critical status. The procedure of comparing images formed by different values of a lithographic operating variable enables qualifying single die reticles and detecting design pattern defects. If the anomaly identified is of a design pattern type, critical status would depend on the number of occurrences and location of the anomaly on the design pattern.

Other preferred implementations of the present invention are methods of qualifying masks, reticles, or other patterns characterized by data bases on which are stored image data acquired by practice of aerial image measurement system (AIMS) or design rule checking (DRC) techniques. In the case of AIMS, the stored image data are acquired by processing multiple aerial images of the reticle, and in the case of DRC, the stored image data are acquired by simulation of the reticle design pattern.

Additional objects and advantages of this invention will be apparent from the detailed description of preferred embodiments thereof, which proceeds with reference to the accompanying drawings.

DETAILED DESCRIPTION OF PREFERRED EMBODIMENTS

A preferred embodiment of the invention implements modulation of focus of light illuminating reticles, each of which is used to expose by a step and repeat or a step and scan process a top layer of photoresist covering a test wafer. The reticles are printed on optimized film stacks, the type of optimization depending on the type of process level, which includes contact or vias, gate, and trench. The base film stack is preferably a simple thermally grown or deposited stack of 1050 Å oxide covered by 320 Å SiON.

Figure 1A:
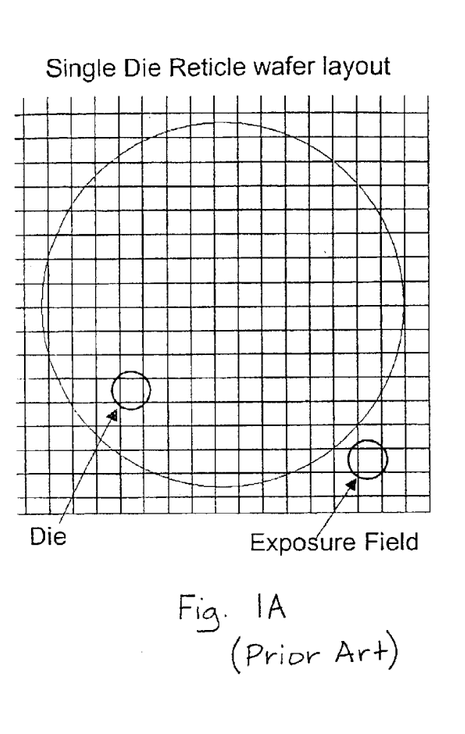
FIGS. 1A and 1B show, respectively, single die reticle and multi-die reticle wafer layouts.
Figure 1B:
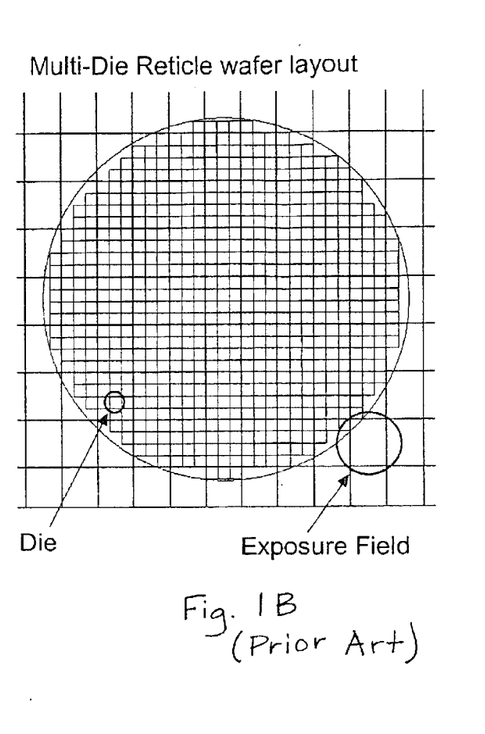

FIGS. 1A and 1B show, respectively, prior art single die reticle (exposure field contains one unique die) and prior art multi-die reticle (array of multiple rows and columns of nominally identical die) wafer layouts and indicate their exposure field and die boundary dimensions. After photoresist patterning, inspection is preferably, but need not be, performed after etching on the SiON/oxide base film stack and stripping the photoresist. Inspecting an etched pattern usually yields a more sensitive inspection.

The exposure layout of the test wafer entails creating by a step and repeat exposure process an array of exposure field regions arranged in rows and columns. A lithographic parameter such as an illumination operating variable is modulated by rows but in only certain columns. Adjacent columns modulated by the operating variable are separated by at least one column not modulated by the operating variable. A typical and preferred operating variable is illumination focus.

Figure 2:
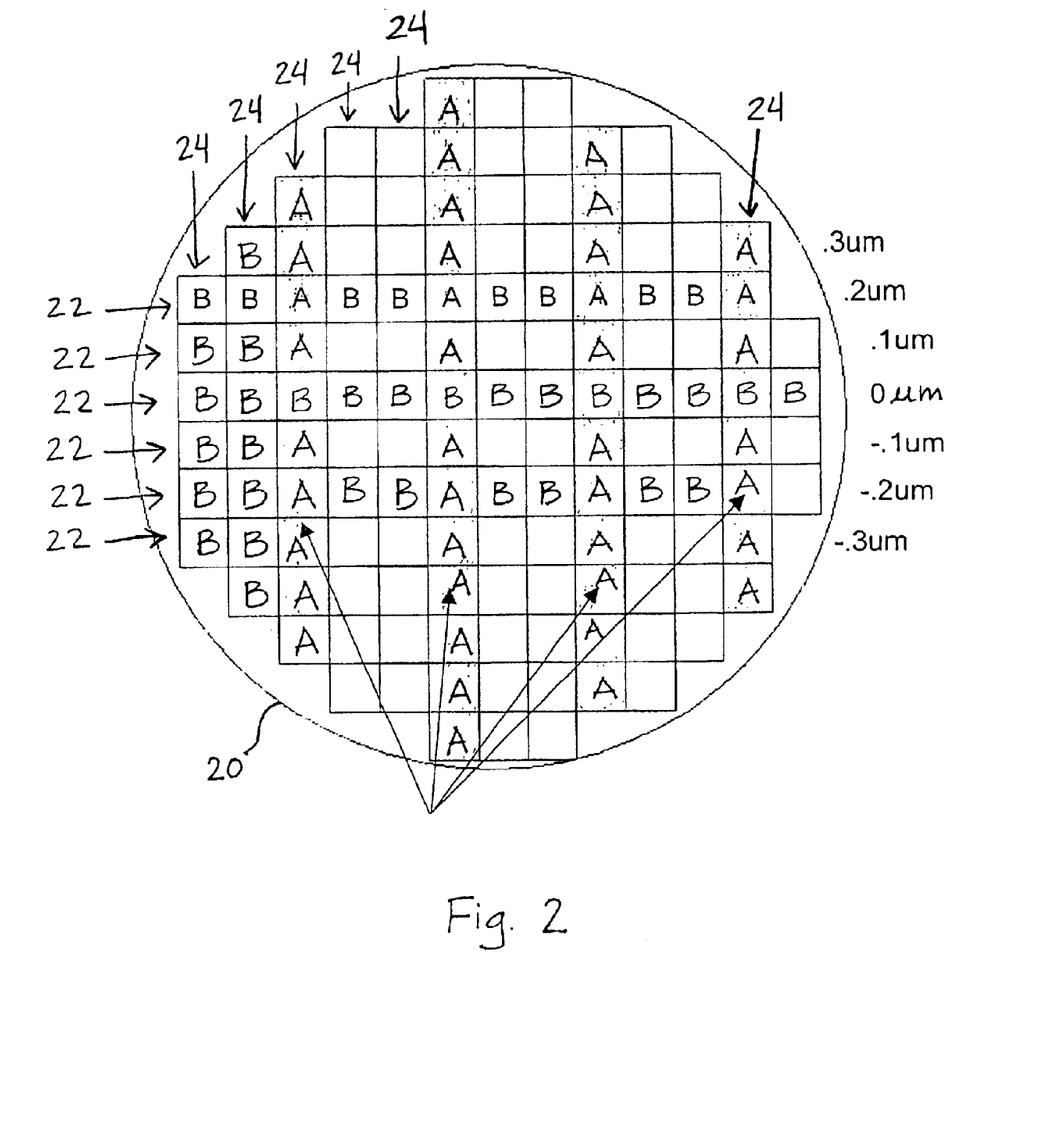
FIG. 2 is a schematic diagram of a wafer, with its surface subdivided into columns representing a "BBA" exposure field layout.

FIG. 2 shows an exposure layout for an exemplary 300 mm test wafer 20 in which illumination focus is progressively modulated in ±0.1 μm increments of defocus in rows 22 positioned either direction away from a constant focus, constant exposure center row (0 μm). Four sets of three columns 24 each include two leading "B" columns of constant focus and constant exposure and one trailing "A" column of the focus condition corresponding to the row with which the "A" column intersects. (For purposes of visual clarity, only some of the exposure field regions are marked with "A" or "B".) The three-column set layout affords double detection of events and subsequent arbitration of die where an event is located. Because the three-column set includes two "B" column dies, there is double detection of good features. A defect inspection tool can determine a difference between a column "A" die and either of the column "B" dies and thereby isolate defects, particularly transient defects. Skilled persons will appreciate that the exposure layout of FIG. 2 can be used on 200 mm wafers as well.

Figure 3:
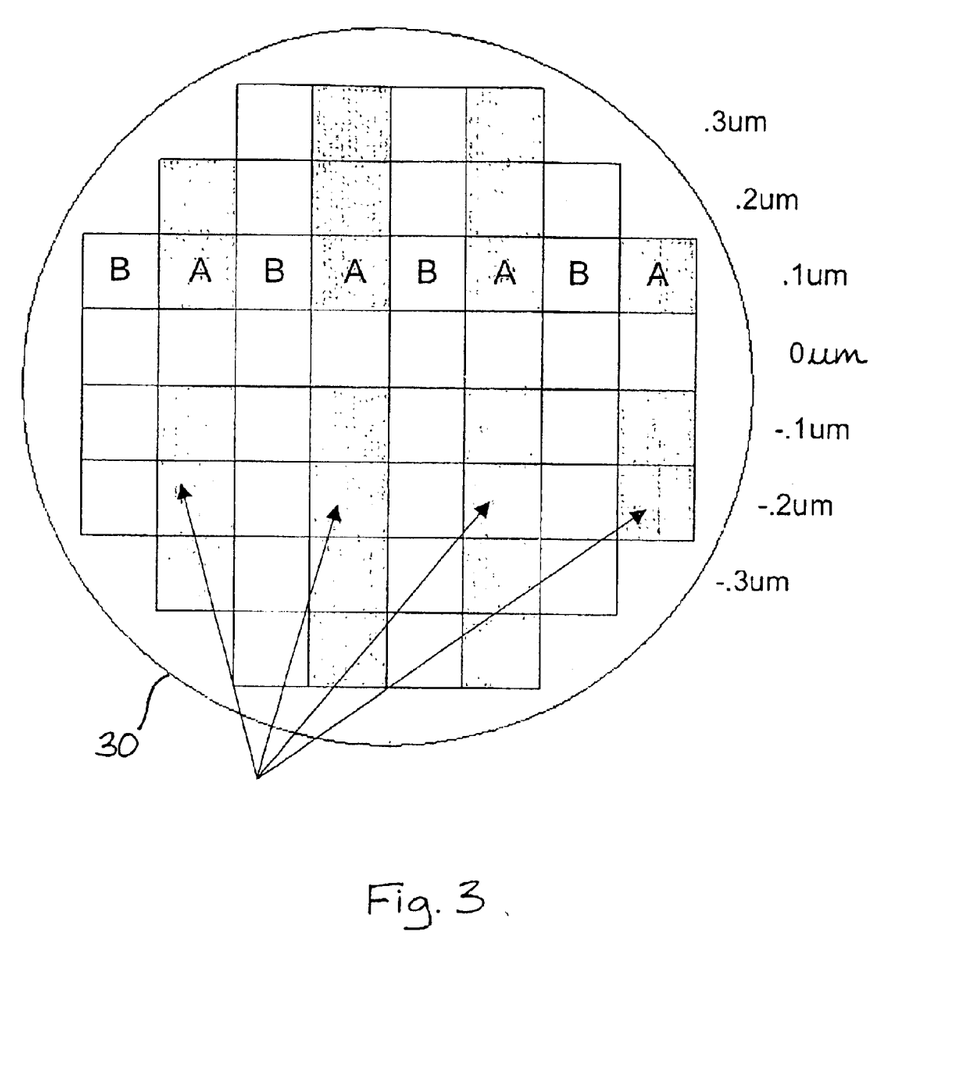
FIG. 3 is a schematic diagram of a wafer, with its surface subdivided into columns representing a "BA" exposure field layout.
Figures 4A, 4B:
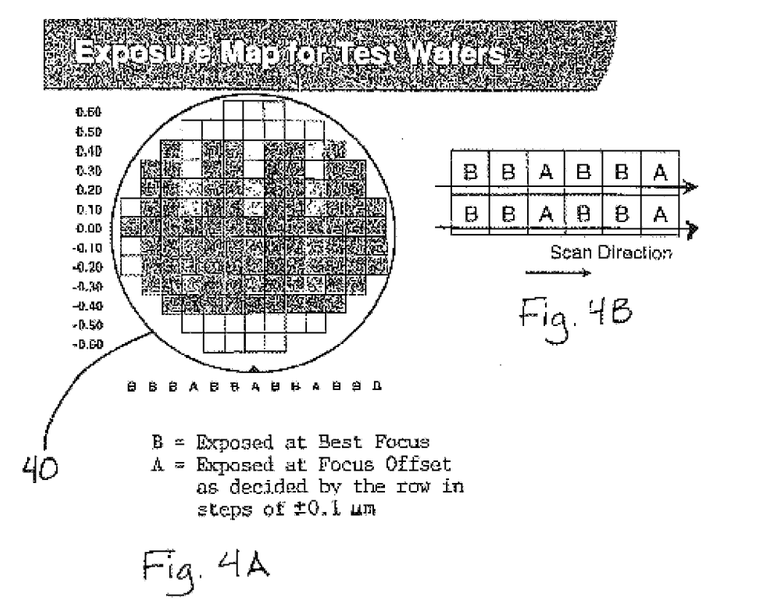
FIG. 4A shows a focus-modulated wafer surface printed with a reticle that is to be qualified according to the "BBA" column pattern of FIG. 2.
FIG. 4B is an enlarged view of several contiguous exposure field regions of the wafer surface of FIG. 4A.

FIG. 3 is an exposure layout shown for an exemplary 200 mm test wafer 30 in which focus is progressively modulated as in the 300 mm test wafer of FIG. 2, but with one exception. The exception is that there are four sets of two columns 24 alternating between a leading "B" column of constant focus, constant exposure and a trailing "A" column of the focus condition corresponding to the row 22 with which the "A" column intersects. The two-column set layout affords single detection of events with possible incorrect event location.

Skilled persons will appreciate that the process window qualification procedure may also be adapted for other lithographic parameters, such as optimizing partial coherence (sigma), numerical aperture (NA), and various illumination modes. Focus is a preferred illumination operating variable because it is the parameter most likely to vary daily from tool to tool. Optimizing other lithographic parameters will depend on the ability of the exposure tool to actively modulate the desired parameter for different exposures. Examples of design of experiment work that may be valuable to a lithography engineer include optimizing a sigma setting that balances tradeoffs between isolated contact or vias and dense contact or vias, optimizing the numerical aperture setting to allow maximum depth of field while retaining an acceptable process window, and choosing an illuminator that yields maximum process latitude for the pattern type being printed.

Figure 5:
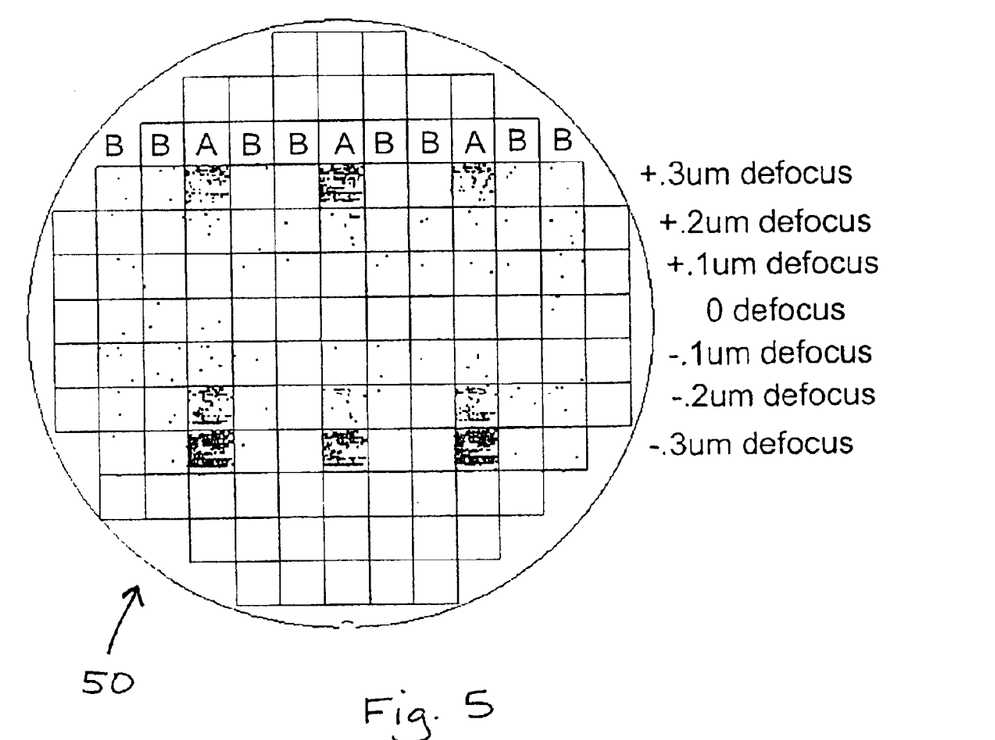
FIG. 5 is a diagram of a defect data map of a scanned test wafer.
Figure 6:
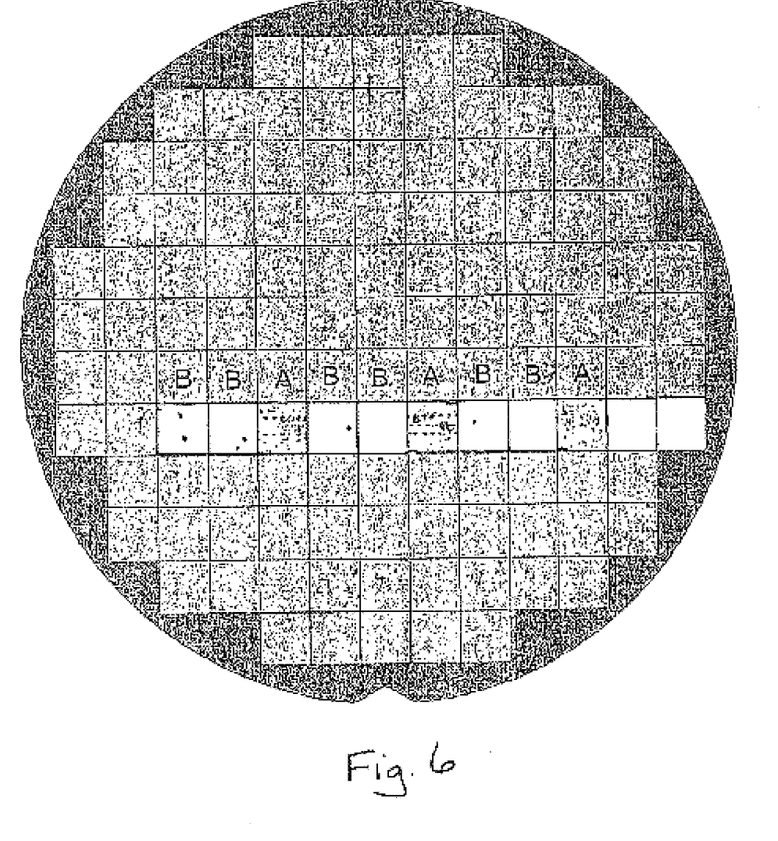
FIG. 6 is a diagram showing the defect event counts in the exposure field regions of the −0.2 μm defocus row of the test wafer of FIG. 5, from which exposure field regions hard repetitive defects have been removed.

FIGS. 4–12 illustrate the steps of sorting pattern anomalies from a test wafer in accordance with the invention. FIG. 4A shows a focus-modulated wafer 40 printed with a reticle that is to be qualified according to a "BBA" column pattern of a type shown in FIG. 2. Modulating the focus amplifies the impact of RET design rule errors. FIG. 4B is an enlarged view of portions of two rows including six columns of exposure field regions to show a preferred scan direction for inspecting the "BBA" column pattern. FIG. 5 is a diagram of a defect map 50 of a scanned test wafer 40 exhibiting increasing defect counts of exposure field regions in rows representing increasing amounts of defocus in ±0.1 μm increments relative to a zero defocus row. Defect map 50 of wafer 40 can contain thousands of defects, including a combination of random defects and repeating defects. FIG. 6 shows the defect event counts in the exposure field regions of the −0.2 μm defocus row of defect map 50 of FIG. 5. The "A" column exposure regions exhibit greater numbers of defect event counts than those exhibited in the "B" column exposure regions, from which "A" and "B" column exposure regions hard repetitive defects have been removed.

Figure 7:
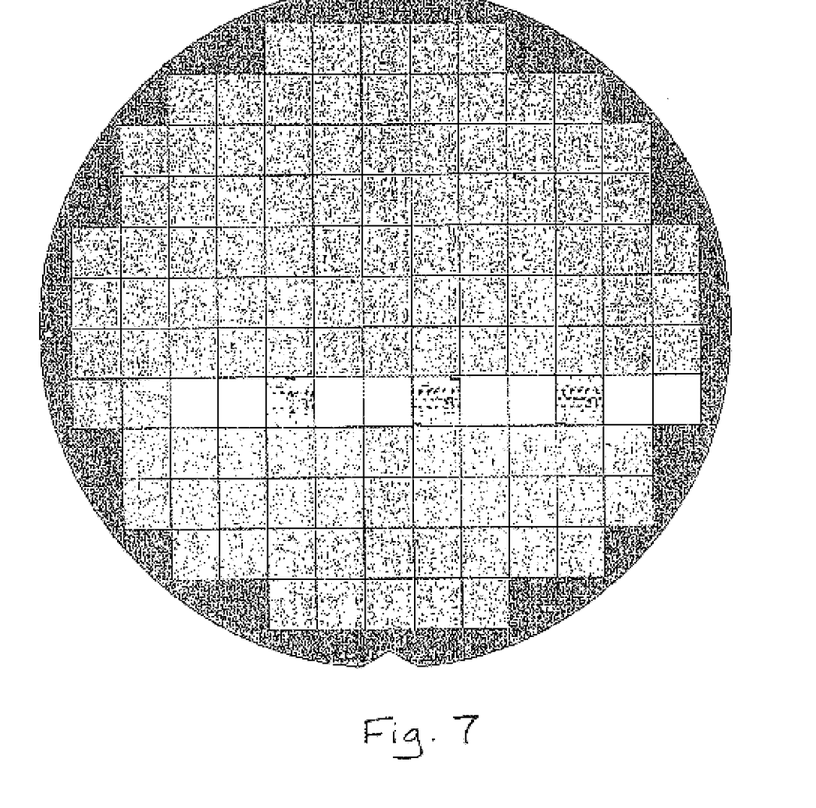
FIG. 7 is a diagram showing the isolation of defect event counts in the defect data files of the "A" columns of FIG. 6.
Figure 8:
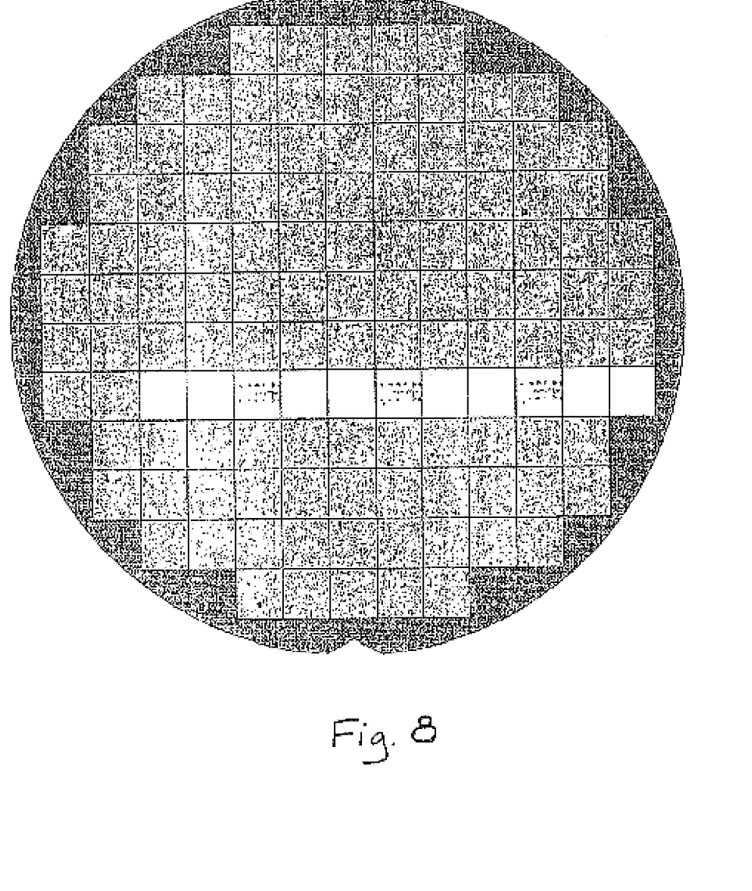
FIG. 8 is a diagram showing the isolation of transient repeater defects present in a stack of the defect data files of the three "A" column exposure field regions of FIG. 7.
Figure 9:
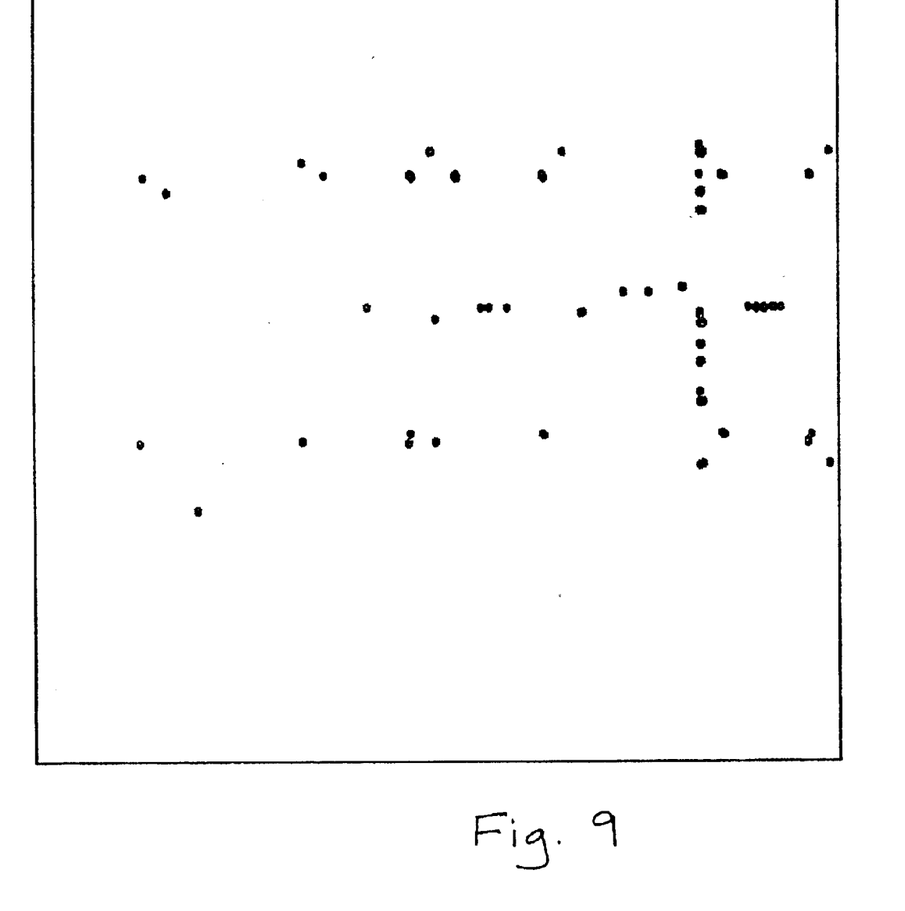
FIG. 9 is an enlarged diagram of the stack of defect data files in the "A" column exposure field regions of FIG. 8.

FIG. 7 shows the isolation of defect event counts in the defect data files of the "A" column exposure field regions of the defect map of FIG. 6. FIG. 8 shows the isolation of transient repeater defects present in a stack of the defect data files of the three "A" column exposure field regions of the test wafer of FIG. 7. This isolation is accomplished by advanced repeating defect algorithms, such as those implemented in KLArity® Defect inspection software available from KLA-Tencor Corporation. FIG. 9 is an enlarged view of the stack of the defect data files of the transient repeater defects in the "A" column exposure field regions of FIG. 8. The defect events shown in FIG. 9 appear on all of the "A" exposure field regions, so any of the "A" regions in the −0.2 μm defocus row may be used to view the defects.

The above-described defect or pattern anomaly isolation process is carried out for the reference (0 μm defocus) row and each of the defocus rows of the process window qualification test wafer, not just the −0.2 μm defocus row described above. Exposure pattern or die stacking performed for each row reduces to several hundred the number of repeating pattern anomalies. Certain of these repeating pattern anomalies are not of interest because they reside in noncritical areas or represent uniform critical dimension variations caused by the focus modulation. After the transient repeater defects have been sorted, the test wafer exposure fields are analyzed to identify the critical repeating pattern anomalies and those associated with RET design rule violations. The objective is to send only a few repeating pattern anomalies to the Critical Dimension Scanning Electron Microscope (CD SEM) for further analysis. Coordinates for further analysis with use of a CD SEM can be recorded automatically for further CD SEM analysis using data obtained in accordance with the processes described herein. Data for CD SEM review can be further selected based on position within the die and criticality as established by the design file (gds2, gds2 derivative, or equivalent data type).

Figure 10:
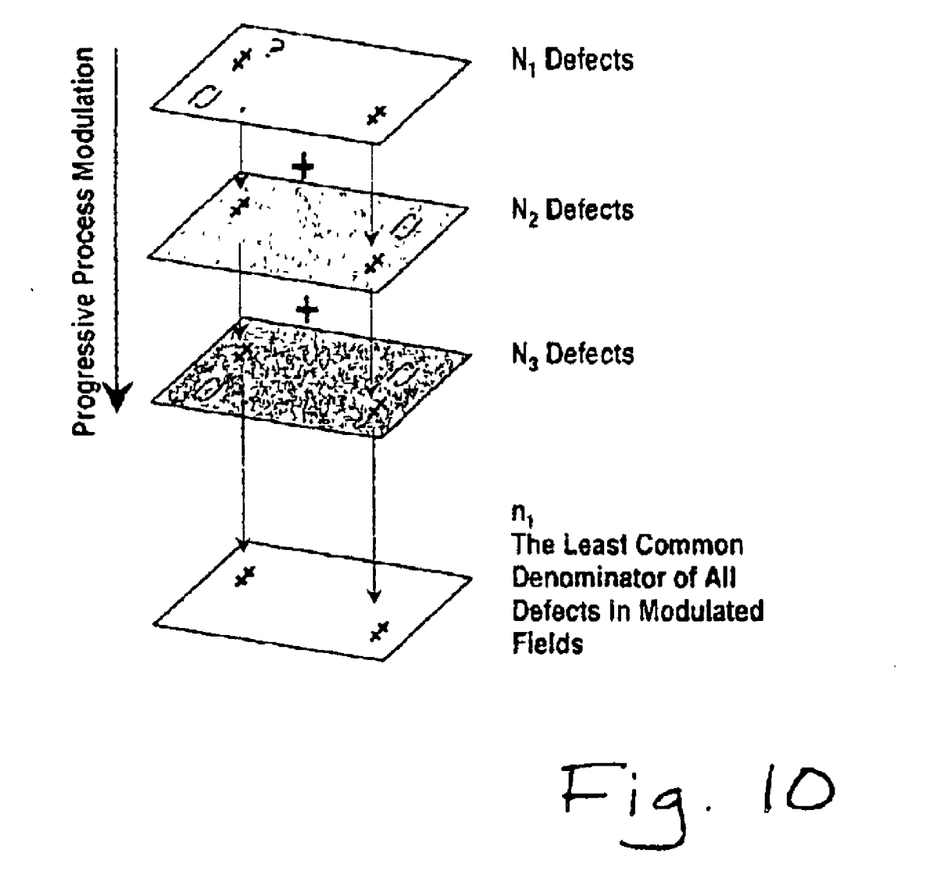
FIG. 10 is a diagram that is useful in explaining the analysis of identifying critical pattern anomalies.

FIG. 10 is a diagram that illustrates the analytical approach used in identifying critical pattern anomalies. The method of analysis of the invention enables qualifying single die reticles and detecting design pattern defects. The pattern anomaly analysis can be summarized as follows. FIG. 10 shows three levels $N_1$, $N_2$, and $N_3$ of one of the "A" column exposure field regions of a die within a 0.3 μm defocus range composed of three 0.1 μm defocus increments. Each of $N_1$, $N_2$, and $N_3$ represents a data file of positions where defects were found upon completion of the subtraction and arbitration processes described above. FIG. 8 illustrates the data base that is the result of the arbitration process illustrated by FIG. 7. The exposure field regions of each "A" column are stacked within the range of defocus increments to determine the locations of design pattern anomalies for increasing amounts of defocus relative to the reference die row of zero defocus. This is accomplished by taking and comparing for a column the differences between different pairs of data files corresponding to exposure field regions located on either side of the reference row. Skilled persons will appreciate that a reference need not be a zero defocus value but could be a value that is appropriate for the lithographic operating variable selected.

FIG. 10 shows that the difference between the reference row and row $N_1$ (+0.1 μm defocus) produces anomalies at four locations; the difference between the reference row and row $N_2$ (+0.2 μm defocus) produces anomalies at three locations, two of which anomalies are common to anomalies in level $N_1$; and the difference between the reference row and row $N_3$ (+0.3 μm defocus) produces anomalies at four locations, three of which anomalies are common to anomalies in level $N_2$ and one of which is common to an anomaly in level $N_1$. FIG. 10 shows a level $n_1$, which represents the least common denominator of all defects in the focus modulated exposure field regions. The defects shown in level $n_1$ represent the most marginal, but are not necessarily the most critical, pattern anomalies. Stacking the difference values of the various defocus levels gives an indication of the weakest features, which include those common to all modulated exposure field regions and those that appear in the level $N_1$ (lowest defocus) modulated exposure field region. The number of occurrences and location of a design pattern anomaly contribute to its critical status.

The "A" column repetitive anomalies that offer the smallest process window are the most important ones. The "A" column repetitive anomalies that appear in row $N_1$ represent, therefore, the weakest features. Selecting the "A" column repetitive anomalies that are common to all modulated fields identifies these weakest features. Reviewing and manually classifying the weakest features indicates the locations of the weaker geometries in the design pattern layout. Weakest features can also be analyzed as described in International Publication No. WO 00/36525, published Jun. 22, 2000. Aligning the file data of isolated defects relative to the design file can be accomplished in a manner described in pending U.S. patent application Ser. No. 10/029,521, filed Dec. 21, 2001.

Figure 11:
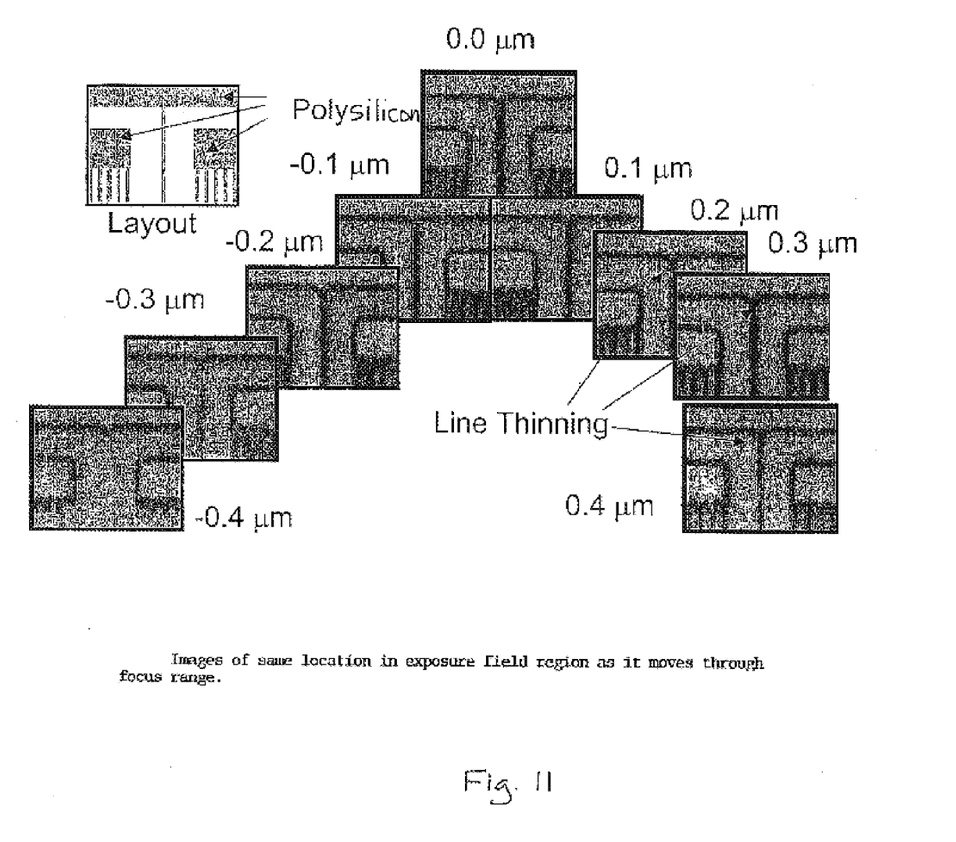
FIG. 11 is a series of optical images showing for a particular location in an exposure field the effects of 0.1 μm defocus increments in a ±4 μm defocus range.

FIG. 11 shows a series of optical images of the same location in an exposure field region for each of 0.1 μm defocus increments in a ±0.4 μm defocus range. FIG. 11 also shows the design pattern layout to which the images nominally correspond. Analysis of FIG. 11 reveals progressive line thinning for increasing defocus increments from zero defocus to +0.4 μm and loss of feature altogether for increasing defocus increments from zero defocus to −0.4 μm.

Figure 12:
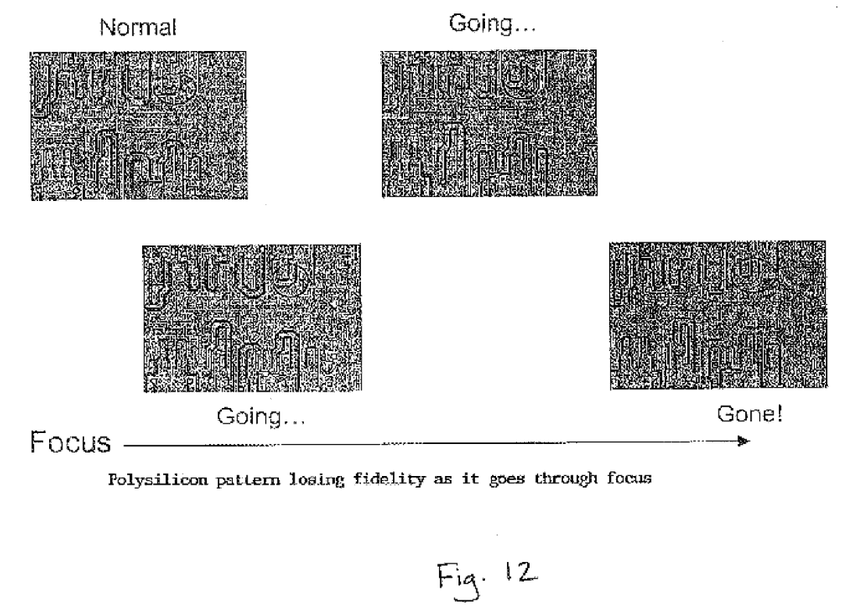
FIG. 12 is a series of optical images of a polysilicon wafer pattern progressively losing line fidelity for increasing amounts of illumination defocus.

FIG. 12 shows a series of optical images of a polysilicon wafer pattern progressively losing line pattern fidelity of an encircled area for increasing amounts of illumination defocus. The leftmost image represents a best focus condition, and the rightmost image represents a defocus condition sufficient to produce a break in the line pattern.

The above described embodiment of the invention entails exposing a test wafer to multiple reticle pattern images formed by different values of focus of light illuminating the reticle. The method of the invention has, however, general applicability in qualifying a pattern, patterning process, or patterning apparatus used in the fabrication of microlithographic patterns for producing microelectronic devices.

For example, the process of comparing images formed by different values of an illumination operating variable as described with reference to FIGS. 6–12 can be carried out on stored image data acquired by practice of AIMS or DRC techniques. The image data can represent a design pattern of a mask, reticle, or other patterned specimen. The AIMS technique and DRC technique entail storing data corresponding to, respectively, aerial images and computed or simulated images of the design pattern for each of the multiple values of an illumination operating variable.

It will be obvious to those having skill in the art that many changes may be made to the details of the above-described embodiments of this invention without departing from the underlying principles thereof. For example, two different illumination operating variables (e.g., focus and exposure duration) could be printed on separate halves of a single test wafer to perform different qualifying experiments on the same wafer. The scope of the present invention should, therefore, be determined only by the following claims.

What is claimed is:

1. A method of qualifying a pattern, patterning process, or a patterning apparatus, comprising:

providing a substrate having a surface covered by a pattern recording material;

causing multiple occurrences of irradiation of a reticle or a mask containing a design pattern, each of the occurrences of irradiation representing a value of a member of a set of lithographic operating variables, and the reticle or mask imparting to the occurrences of irradiation design pattern information corresponding to each of the values of the member of the set;

causing on the pattern recording material occurrences of irradiation carrying the design pattern information imparted by the reticle or mask;

recording in the pattern recording material a spatial pattern corresponding to the design pattern information imparted by the reticle or mask for each of the values of the member of the set, each spatial pattern recorded at a different region of the pattern recording material; and determining from the recorded spatial patterns a presence of a pattern anomaly associated with the pattern, patterning process, or patterning apparatus.

2. The method of claim 1, in which the set of lithographic operating variables comprises illumination operating variables that include as members at least one of illumination focus, exposure, degree of partial coherence, illumination mode, or numerical aperture.

3. The method of claim 1, in which the occurrences of irradiation are occurrences of light and the pattern recording material is a photoresist material.

4. The method of claim 1, in which:

the different regions are arranged in multiple adjacent rows, each one of the rows including regions of recorded spatial patterns corresponding to a particular value of the member of the set;

the determining of a presence of a pattern anomaly includes taking differences between different pairs of the recorded spatial patterns corresponding to different values of the member of the set; and comparing the differences between the different pairs to determine which ones of the differences exhibit events that repeat and thereby isolate a possible pattern anomaly.

5. The method of claim 4, in which the reticle is of a single die type.

6. The method of claim 5, in which the particular values of the member of the set represent a range of modulated values of illumination focus.

7. The method of claim 1, in which:

the different regions are arranged in multiple rows and multiple columns, each one of the multiple rows including regions of recorded spatial patterns corresponding to a particular value of the member of the set, and at least some of the multiple columns including regions of the recorded spatial patterns corresponding to different values of the member of the set;

the determining of a presence of a pattern anomaly includes taking differences between different pairs of the recorded spatial patterns in a particular column; and comparing the differences between the different pairs to determine which ones of the differences exhibit events that repeat and thereby isolate a possible pattern anomaly.

8. The method of claim 7, in which a value of the member of the set represents a reference member value and each of the rows includes multiple reference regions of a recorded spatial pattern corresponding to the reference member value, at least one reference region being positioned between each adjacent pair of regions of recorded spatial patterns corresponding to a particular value of the member of the set.

9. The method of claim 8, in which the reticle is of a single die type.

10. The method of claim 1, in which the determining of a presence of a pattern anomaly is accomplished by comparisons of recorded spatial patterns corresponding to different values of a reference member and only one other member of the set.

11. The method of claim 1, in which the set of lithographic operating variables includes irradiation exposure conditions so that a presence of a pattern anomaly results from effects of irradiation exposure conditions.

12. The method of claim 1 in which:

the different regions are arranged in multiple adjacent rows including first, second, and third regions of recorded spatial patterns corresponding to, respectively, first, second, and third values of an illumination condition member of the set, the first value representing a reference value;

the determining of a presence of a pattern anomaly includes taking a difference between the first and second values and a difference between the first and third values of the illumination condition member; and comparing the differences to determine whether they exhibit an event that repeats and thereby indicates a possible pattern anomaly.

13. The method of claim 1, in which the pattern anomaly results from a design pattern defect.

14. A method of qualifying a pattern, a patterning process, or a patterning apparatus, comprising:

acquiring multiple spatial patterns corresponding to a lithographic pattern containing a design pattern, the multiple patterns acquired for different values of a member of a set of lithographic variables;

determining a presence of a design pattern anomaly by taking differences between different pairs of the acquired spatial patterns corresponding to different values of the member of the set; and comparing the differences between the different pairs to determine which ones of the differences exhibit events that repeat and thereby isolate a possible pattern anomaly.

15. The method of claim 14, in which one of the values of the member of the set represents a reference member value.

16. The method of claim 15, in which each of the different pairs includes the reference value.

17. The method of claim 14, in which the multiple spatial patterns correspond to aerial images of the design pattern of a reticle or mask.

18. The method of claim 14, in which the multiple spatial patterns correspond to simulated images of the design pattern of a reticle or mask.

19. The method of claim 14, in which the lithographic pattern is that of a reticle of a single die type.

20. The method of claim 14, in which the pattern anomaly results from a design pattern defect.

* * * * *